United States Patent
Kang et al.

(10) Patent No.: US 7,539,063 B2
(45) Date of Patent: May 26, 2009

(54) FLASH MEMORY DEVICES AND PROGRAMMING METHODS FOR THE SAME

(75) Inventors: Sang-Gu Kang, Suwon-si (KR); Young-Ho Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 196 days.

(21) Appl. No.: 11/651,521

(22) Filed: Jan. 10, 2007

(65) Prior Publication Data
US 2008/0068883 A1    Mar. 20, 2008

(30) Foreign Application Priority Data
Sep. 15, 2006    (KR) ...................... 10-2006-0089685

(51) Int. Cl.
*G11C 11/34*    (2006.01)
(52) U.S. Cl. ........................ 365/185.22; 365/185.33; 365/189.011; 365/189.04
(58) Field of Classification Search ............ 365/185.22, 365/185.33, 189.011, 189.04
See application file for complete search history.

(56) References Cited

U.S. PATENT DOCUMENTS

| | | | |
|---|---|---|---|
| 5,784,317 A * | 7/1998 | Ha ......................... | 365/185.22 |
| 6,091,631 A | 7/2000 | Kucera et al. | |
| 6,236,593 B1 * | 5/2001 | Hong et al. ............ | 365/185.11 |
| 6,288,935 B1 | 9/2001 | Shibata et al. | |
| 2005/0207220 A1 | 9/2005 | Takeuchi | |

FOREIGN PATENT DOCUMENTS

| | | |
|---|---|---|
| JP | 09-139092 A | 5/1997 |
| JP | 2001-093288 | 4/2001 |
| JP | 2005-108303 | 4/2005 |
| JP | 2005-267687 | 9/2005 |
| KR | 10-2000-0005160 A | 1/2000 |
| KR | 1020010070086 A | 7/2001 |
| KR | 1020050093667 A | 9/2005 |

* cited by examiner

*Primary Examiner*—Son Dinh
*Assistant Examiner*—Nam Nguyen
(74) *Attorney, Agent, or Firm*—Harness, Dickey & Pierce, P.L.C.

(57) ABSTRACT

Flash memory devices and methods of programming the same are provided. The flash memory devices include a plurality of memory cells storing multi-bit data representing at least one of first through fourth states and including most significant bits and least significant bits. The method includes programming the plural memory cells into a provisional state according to the least significant bit, and programming the plurality of memory cells into the second through fourth states from the first and provisional states according to the most significant bit. Programming the plurality of memory cells into the second through fourth states includes simultaneously programming the plurality of memory cells at least partially into at least two states during one programming operation period.

31 Claims, 7 Drawing Sheets

Fig. 3

Option 1

| Program sequence | Example of case combination | |
|---|---|---|
| 1st Program | Case3 | Case2 | Case1 |
| 2nd Program | Case1 + Case2 | Case1 + Case3* | Case2 + Case3 |

'Case3*' is programming operation from '10' to '00'

Fig. 4

Option 2

| Program sequence | Example of case combination | | | |
|---|---|---|---|---|
| 1st Program | Case3 | Case2 | ... | Case1 |
| 2nd Program | Case2 | Case1 | ... | Case2 |
| 3rd Program | Case1 | Case3* | ... | Case3* |

'Case3*' is programming operation from '10' to '00'

FLASH MEMORY DEVICES AND PROGRAMMING METHODS FOR THE SAME

PRIORITY STATEMENT

This non-provisional U.S. patent application claims priority under 35 U.S.C. § 119 to Korean Patent Application No. 2006-89685, filed on Sep. 15, 2006, in the Korean Intellectual Property Office (KIPO), the entire contents of which are incorporated herein by reference.

BACKGROUND

Volatile and nonvolatile memories are utilized more and more in mobile apparatuses such as MP3 players, personal multimedia players (PMP), mobile phones, notebook computers, personal digital assistants (PDA), etc. These mobile apparatuses require storage units with greater storage capacity for providing various functions (e.g., playing motion pictures). One example of larger capacity storage units is a multi-bit memory device in which each memory cell stores multi-bit data (e.g., 2 or more bits of data). For the sake of clarity, a memory cell storing multi-bit data is hereinafter referred to as multi-level cell (MLC).

When storing 1-bit data in a single memory cell, the memory cell is conditioned on a threshold voltage corresponding to one of two threshold voltage states. For example, at a given time the memory cell has one of two states representing data '1' and data '0'. When a single memory cell stores 2-bit data, the memory cell is conditioned on a threshold voltage corresponding to one of four threshold voltage states. For example, the memory cell has one of four states representing data '11', data '10', data '00', and data '01'. In order to keep threshold voltage distribution profiles within corresponding windows, the threshold voltages may be adjusted to be dense within each window. For this adjustment, a programming method such as an incremental step pulse programming (ISPP) may be used. In an example ISPP method, a threshold voltage shifts up by incremental rates of a program voltage upon repetition of programming loops. The distribution of threshold voltages may be controlled by lowering the incremental rate of the program voltage. By using such an ISPP method, an MLC stores 2-bit data using LSB and MSB page programming. The most significant bit (MSB) refers to an upper bit of 2-bit data stored in the MLC and a least significant bit (LSB) refers to a lower bit of 2-bit data stored in the MLC. In a conventional NAND flash memory device using page unit programming, one page may be programmed by writing corresponding LSBs and MSBs in sequence.

FIG. 1 schematically shows a programming sequence for a conventional flash memory device including MLCs. Referring to FIG. 1, in programming an MLC, an LSB and an MSB may be programmed sequentially. In programming the LSB, the MLC selected for programming may be set to state '10' from a state '11', or may maintain an erased state '11'. Subsequently, in programming the MSB of the selected MLC, the MSB may transition to '0'. For example, the MLC may be programmed into a state '01' from the erased state '11' Oran MLC, which has already been programmed into state '10' in the LSB programming step, may maintain state '10' or transition to state '00'. However, the LSB programming operation may involve a rising rate of cell threshold voltage relative to the MSB programming operation. In other words, the LSB programming operation may include a greater number of program loops than the MSB programming operation. As the number of program loops increases, coupling effects may be caused in adjacent memory cells.

FIG. 2A shows an LSB programming method for suppressing influence of rising threshold voltages due to coupling effects between adjacent cells and/or reducing coupling effects during LSB programming in an MLC flash memory device. Referring to FIG. 2A, during LSB programming, a selected MLC is programmed from erased state '11' (10) into a previous provisional state '10*' (20), but not into the state '10' (30). In this example, a verifying read voltage Vvfy2$_{13}$ low may be lower than a verifying read voltage Vvfy2 corresponding to state '10' (30). As a result, during LSB operation, coupling effects to adjacent cells may be reduced because a lower threshold voltage (e.g., lower verifying read voltage Vvfy2_low) is used to transition the MLC from erased state '11' to provisional state '10*' (20).

FIG. 2B schematically shows a conventional MSB programming method performed subsequent to the LSB programming. Referring to FIG. 2B, Case1, Case2, and Case3 represent state transition patterns for transitioning an MSB from provisional state '10*' or erased state '11'. An MLC may be programmed by transitioning an MSB from erased state '11' (10) to state '01' (40). An MLC, which has already been programmed into provisional state '10*' (20), may be programmed to state '10' (30) or state '00' (50). In this example, even though the distribution profile of provisional state '10*' (20) has been preliminarily extended by coupling effects of adjacent memory cells, the MSB programming operation may assist in making the distribution of threshold voltages result in a denser profile ('10' or '00').

However, according to conventional data programming methods, programming times for MSBs may vary for Case1, Case2 and Case3. In programming one MSB page, Case1, Case2 and Case3 are performed sequentially in a number of program loops, and thus, programming time for one MSB page may be relatively long.

SUMMARY

Example embodiments provide flash memory devices and methods for programming the same, which may have shorter programming times.

Example embodiments disclosed herein relate to flash memory devices, for example, a flash memory device storing multi-bit data and a method of programming the flash memory device.

Example embodiments provide flash memory devices and MSB program methods, which may improve and/or optimize programming times for MSBs in multi-level cells.

At least one example embodiment provides a method of programming a flash memory device including a plurality of memory cells. Each of the plurality of memory cells may store multi-bit data and the multi-bit data may represent at least one of first through fourth states. The multi-bit data may include a most significant bit and a least significant bit. According to this example embodiment, at least a first memory cell may be programmed into a provisional state according to the least significant bit stored in the first memory cell. A first portion of the plurality of memory cells may be programmed into one of the second through fourth states from the first state, and a second portion of the plurality of memory cells may be programmed into one of the second through fourth states from the provisional state according to the most significant bit stored in each memory cell.

At least one other example embodiment provides a method of programming a flash memory device including a plurality of memory cells. According to at least this example embodiment, at least one of the plurality of memory cells may be programmed into a provisional state according to a least significant bit stored in the at least one memory cell. A first portion of the plurality of memory cells may be programmed into one of a second through fourth states from a first state, and a second portion of the plurality of memory cells may be programmed into one of the second through fourth states from the provisional state in accordance with one of a plurality of different programming modes in response to a selected mode of programming.

Another example embodiment provides a flash memory device. According to at least this example embodiment, the flash memory device may include a cell array having a plurality of memory cells. Each of the plurality of memory cells may store multi-bit data, and the multi-bit data may represent at least one of a first through a fourth state and may include at least a most significant bit and a least significant bit. The flash memory device may further include a voltage generator, a page buffer, a program controller and a selector. The voltage generator may be configured to generate and provide a program voltage and verify-read voltages to a word line of memory cells selected from the plurality of memory cells. The page buffer may be coupled to bit lines of the plurality of memory cells, and may be configured to write multi-bit data to the selected memory cells and configured to conduct verify-read and read operations. The program controller may be configured to regulate the page buffer and the voltage controller to program most significant bits to the plurality of memory cells based on selected option information. The selector may be configured to select one of first and second programming modes and generate the option information.

At least one example embodiment provides a method of programming a flash memory device with pluralities of memory cells storing multi-bit data representing at least one of first through fourth states and including most and least significant bits. In at least this example embodiment, the plural memory cells may be programmed into a provisional state in accordance with the least significant bit. The plural memory cells may be programmed into the second through fourth states from the first and provisional states in accordance with the most significant bit. The plural memory cells may be programmed into the second through fourth states by simultaneously programming the plural memory cells at least partially into at least two states during one programming operation period.

At least one other example embodiment provides a method of programming a flash memory device with pluralities of memory cells storing multi-bit data representing at least one of first through fourth states and including most and least significant bits. In at least this example embodiment, the plural memory cells may be programmed into a provisional state in accordance with the least significant bit, and the plural memory cells may be programmed into the second through fourth states from the first or provisional state in accordance with one of different programming modes in response to information of option for selecting a mode of programming the most significant bit.

Another example embodiment provides a flash memory device. The flash memory device, according to at least this example embodiment, may include a cell array, a voltage generator, a page buffer, a program controller and a selector. The cell array may include pluralities of memory cells storing multi-bit data representing at least one of first through fourth states and including most significant bits and least significant bits. The voltage generator may be configured to provide a program voltage and verify-read voltages of plural levels to a word line of memory cells selected from the plural memory cells. The page buffer may be coupled to bit lines respective to the plural memory cells, and may be configured to write the multi-bit data into the selected memory cells and conduct verify-read and read operations. The program controller may be configured to regulate the page buffer and the voltage controller to program the most significant bits into the plural memory cells in response to information of option. The selector may be configured to select one of first and second options in a programming mode with the most significant bit.

According to at least some example embodiments, the programming of the first portion and the second portion may be performed during one programming operation period. A verify-read voltage for programming the first memory cell into the provisional state may be higher than a verify-read voltage corresponding to the second state, but lower than a verify-read voltage corresponding to the third state.

According to at least some example embodiments, the simultaneous programming may further include a first programming stage and a second programming stage. In the first programming stage memory cells may be programmed into one of the second through fourth states from the first or provisional state. In the second programming stage the memory cells may be simultaneously programmed from the first or provisional state into states excluded from the first programming stage. The first programming stage may program memory cells from the provisional state to the fourth state. During the second programming stage, memory cells excluded from the first programming stage may be simultaneously programmed from the first state into the second state and from the provisional state into the third state.

According to at least some example embodiments, the first, second, third and fourth states correspond to '11', '01', '10' and '00', respectively, and the provisional state may have an associated voltage level higher than a voltage level associated with the second state, but lower than a voltage level associated with the third state. The second programming stage may include verifying whether the memory cells have been programmed into the second and third states using two program loops including two verify-read operations.

According to at least some example embodiments, the one programming operation period may be a program cycle for which bit data may be written in an incremental step pulse programming (ISPP) mode.

BRIEF DESCRIPTION OF THE DRAWINGS

Non-limiting and non-exhaustive example embodiments will be described with reference to the following figures, wherein like reference numerals refer to like parts throughout the various figures unless otherwise specified. In the figures:

FIG. 3 shows a programming sequence for an MSB programming method, according to an example embodiment;

FIG. 4 shows a programming sequence for an MSB programming method, according to another example embodiment;

DETAILED DESCRIPTION OF EXAMPLE EMBODIMENTS

Figure 1:
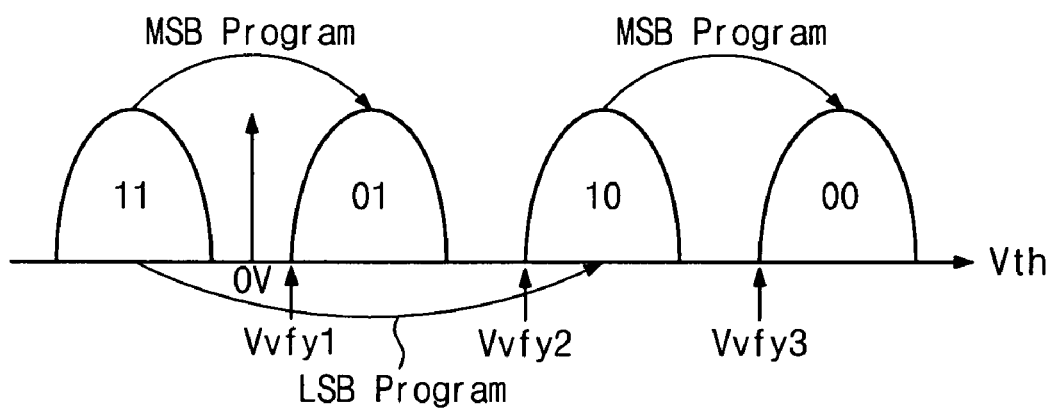
FIG. 1 is a schematic diagram showing a conventional method of programming in an MLC flash memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Throughout the description herein, as a unit of programming operation, a 'program loop' refers to a period during which a word line is supplied with a program voltage Vpgm of a single pulse and a verify-read voltage Vvfy corresponding to the program voltage. A 'program cycle' refers to a period during which memory cells are programmed using a plurality of program loops, according to an example ISPP method. Thus, a program cycle may include pluralities of program loops by which the program voltage Vpgm may increase.

FIG. 3 is a table showing a program sequence for an MSB programming method or operation, according an example embodiment. The programming method of FIG. 3 will be referred to herein as Option 1 for the sake of clarity.

Figure 2A:
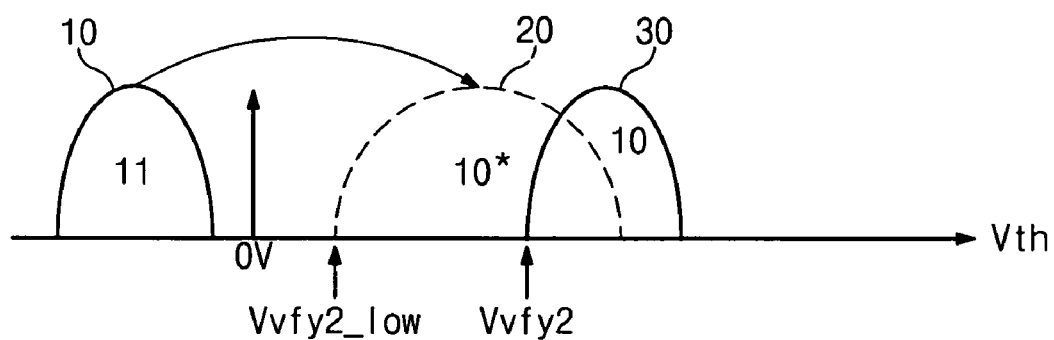
FIG. 2A is a schematic diagram showing a conventional method of programming an MLC flash memory device.
Figure 2B:
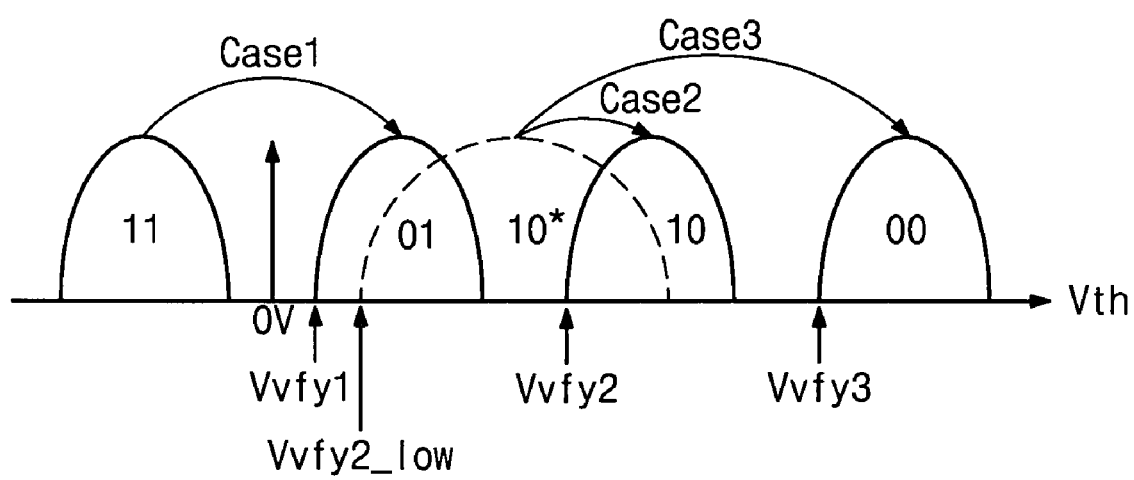
FIG. 2B is a schematic diagram showing a conventional method of programming MSB in an related art MLC flash memory device.

Referring to FIG. 3, example embodiments will be described with respect to an MSB programming method in which the third case (Case3) is performed out during the first programming stage and the first and second cases (Case1+Case2) are simultaneously performed during the second programming stage. Hereinafter, various steps of the MSB programming method, according to a first option (Option 1), will be described in conjunction with FIGS. 2A and 2B. As noted above, according to at least this example embodiment, the MSB programming method may include a first programming stage for programming memory cells from provisional stage '10*' to state '00' (Case3). The MSB programming method, according to at least this example embodiment, may further include of a second programming stage for programming memory cells from the state '11' into the state '01' (Case 1) and from provisional stage '10*' to state '10' (Case2) in the same program cycle. Although only the above-described example embodiment will be described herein, Case1, Case2 and Case3, included in the first and second programming stages belonging to the first option (Option 1) may be configured as desired.

After completing a programming operation for an LSB page, the flash memory device may perform a read operation to determine whether memory cells are currently in erased state '11' (10) or provisional state '10*' (20). Results of the detection may be stored in first latches of a page buffer (not shown), and data of an MSB page may be loaded into second latches of the page buffer, for example, in parallel with the detection results. In at least this operation, a page buffer unit corresponding to a memory cell may be designed to store multi-bit data (e.g., 2-bit data). For instance, data '1' may be stored in the first latch of each page buffer when the detection result indicates that a corresponding memory cell is in an erased state '1', whereas data '0' may be stored in the first latch of each page buffer when the detection result indicates that the corresponding memory cell is in a provisional state '10*'. MSB page data to be programmed may be loaded in the second latches of corresponding page buffer units. If 'A' is a data bit of the first latch corresponding to one memory cell and 'B' is a data bit of the second latch, a latch state of the page buffer unit may be represented as [AB]. In this example, during the first programming stage, memory cells corresponding to page buffer units having a latch state [00] may be selected for conducting the third case (Case3). After completing the first programming stage, memory cells to be programmed into state '01' from erased state '11' and memory cells to be programmed into state '10' from provisional state '10*' may be selected for the second programming stage. For example, memory cells corresponding to page buffer units having latch states [10] and [01] may be selected.

The second programming stage may include multiple stages, for example, two stages of programming operations (e.g., '11'→'10' and '10*'→'10') performed during one program cycle. In this example, one program loop may require two verify-read operations. For example, after applying the program voltage Vpgm to a word line, a verify-read operation may be performed using verify-read voltages Vvfy1 and Vvfy2. As a result, a period of the program loop in the second programming stage may include two verify-read operations. The program loop of the second programming stage may be longer than a program loop of the first programming stage; however, because the second programming stage performs two stages of programming operations simultaneously, the number of program loops may be reduced relative to the conventional art in which Case1, Case2 and Case3 are performed sequentially and/or independently.

As discussed above, while the aforementioned example embodiment is associated with the first option (Option 1) in which Case3 is performed during the first programming stage, while the Case1 and Case2 are performed concurrently during the second programming stage, example embodiments are not limited thereto. For example, as illustrated in FIG. 3, in at least one other example embodiment, Case2 may be performed during the first programming stage and Case1 and Case3 may be performed concurrently during the second programming stage.

FIG. 4 is a table showing a programming sequence for an MSB programming operation, according to another example embodiment. For the sake or clarity, the example embodiment shown in FIG. 4 will be referred to as Option 2. Referring to FIG. 4, the MSB programming operation may include first through third programming stages, each of which may perform one of Case 1, Case2 or Case3. In the second option (Option 2), according to an example embodiment, the cases may be performed sequentially. Thus, at least three program cycles may be needed to program one MSB page. The program loop proceeding in each program cycle may include one operation for applying the program voltage and one verify-read operation. However, combinations of cases may be alterable.

For example, according to one example embodiment, Case3 may be performed in a first programming stage to transition the MSB from a provisional state '10*' (20) to state '00'. In the second programming stage, Case2 may be performed to transition the MSB from provisional state '10*' (20) to state '10'. In the third programming stage, Case1 may be performed to transition the MSB from erased state '11' to state '01'.

Figure 5:
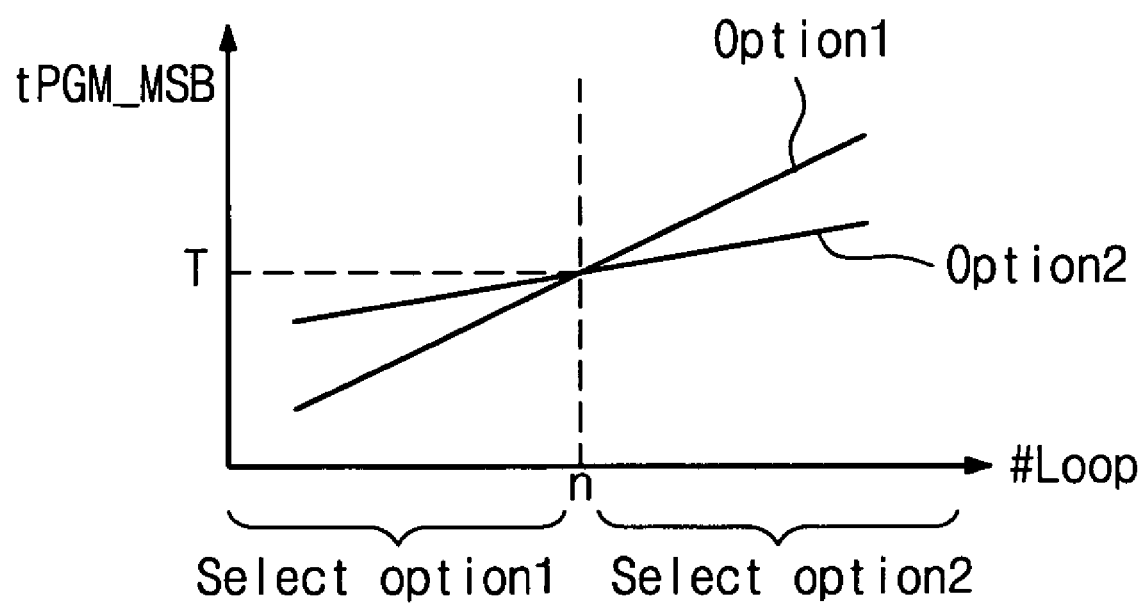
FIG. 5 is a graph showing program characteristics associated with first and second options, according to example embodiments.

FIG. 5 is a graph of execution time for MSB programming versus number of program loops. The graph of FIG. 5 shows program characteristics associated with above-described Options 1 and 2. Referring to FIG. 5, the MSB program time varies according to the number of loops. The difference in MSB program time tPGM_MSB may be caused by characteristics of Option 1. In the second programming stage of Option 1, one program loop may include two verify-read operations. However, in the second programming stage of Option 1, as two cases are performed concurrently, the number of program cycles for writing data in one MSB page may be 2, which is less than that of Option 2. As a result, Option 1 may be operable with a smaller number of program loops for MSB programming. However, the average period of the program loop may be longer than that of the Option 2. On the other hand, Option 2 may be operable with a larger number of program loops for MSB programming, but the average period of the program loop may be shorter than that of Option 1. Such optional features of the MSB programming time provide option selectivity. For example, an alternative one of the two options may be selected based on detected characteristics of memory cells to improve and/or optimize MSB programming time and/or efficiency.

As illustrated in FIG. 5, when Option I is selected (e.g., adopted) as the MSB programming mode, memory cells requiring a larger number of program loops may have longer MSB programming times, for example, a programming time greater than that of the Option 2. During the second programming stage of Option 1, one program loop may include two verify-read operations, each having a loop period (e.g., 70 μs) longer than a conventional program loop period (e.g., 50 μs). Therefore, Option 1 may require a longer or relatively long programming time for memory cells requiring a larger number of program loops. However, if the number of the program loops is smaller or relatively small (e.g., less than n), Option 1 may have improved operating speed relative to Option 2. Otherwise, the Option 2 may consume more program time in memory cells requiring a smaller number of program loops during MSB programming. The Option 2 may be performed with three program cycles, however, each loop may include only one verify-read operation.

Assuming, for example purposes, a time for one program loop is tMSB1, when one program cycle includes one case (e.g., one of Case1, Case2 or Case3), and tMSB2 when one program cycle includes two cases, tMSB2 may be longer than tMSB1. Additionally, even in the number of program loops, cell characteristics may vary with respect to the selected option. For example, there may be a difference, in the number of loops for programming an MSB page between Option 1 and Option 2. The number of loops required for programming the MSB when one programming step includes one case is referred to as $Loop1_{MSB}$, while the number of loops until pass states when one programming step includes two cases is referred to as $Loop2_{MSB}$. In this example, $Loop2_{MSB}$ may be smaller than $Loop1_{MSB}$.

The above-described conditions may be represented by Equation 1.

$$tMSB1 < tMSB2$$

$$Loop1_{MSB} < Loop2_{MSB} \qquad \text{[Equation 1]}$$

Considering program characteristics of memory cells in accordance with Equation 1, an option suitable for improving and/or optimizing program speed in a memory device may be selected.

In at least some example embodiments, Option 2 may be more suitable for memory cells requiring a larger number of program loops (e.g., larger than n times) for programming, whereas Option 1 may be more suitable for memory cells requiring a smaller number of program loops (e.g., smaller than n times) for programming.

Figure 6:
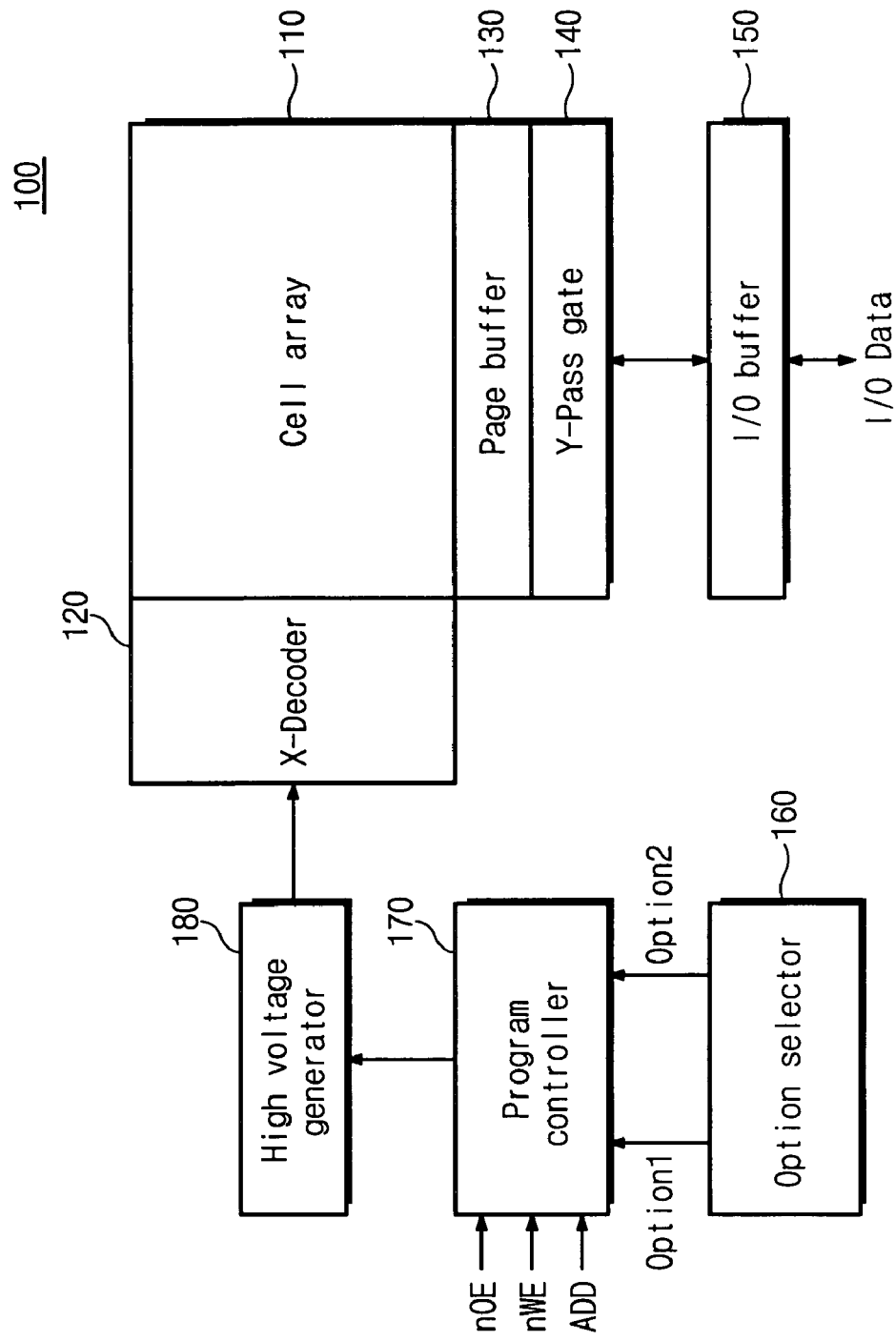
FIG. 6 is a block diagram illustrating a flash memory device, according to an example embodiment.

FIG. 6 is a block diagram illustrating a flash memory device, according to an example embodiment. The flash memory device may be programmed using the above-described MSB programming methods.

Referring to FIG. 6, the flash memory device 100 may include a cell array 100 configured to store multi-bit data, a page buffer 130 and/or a program controller 170. The flash memory device 100 may further include a selector (e.g., an option selector) 160. The selector 160 may be configured to select a mode (or option) of MSB programming. The program controller 170 may perform MSB programming, according to the selected option (e.g., Option 1 or Option 2) in response to option selection signals Option1 and Option2 generated by the selector 160.

The cell array 110 may include a plurality or pluralities of memory cells arranged at intersections of word lines and bit lines. The cell array 110 may be composed of memory blocks, each of which may provide a unit of erasure. Each memory block may also be defined as a programming unit and may be segmented into a plurality of pages. Each page may include a group of memory cells sharing a word line. During an example programming operation, program data loaded in a page buffer 130 may be written into memory cells in the unit of a page. In programming the cell array 110 formed of MLCs, data may be written (e.g., sequentially written) in the unit of two pages to reduce coupling effects between adjacent cells and/or enhance boosting efficiency.

An X-decoder 120 may selectively supply a word line voltage from a high voltage generator 180 to a word line of the cell array 110 in response to a row address (not shown). In at least this example embodiment, the X-decoder 120 may select a memory block in response to a block address, and select a page thereof. During an example programming operation, the X-decoder 120 may supply a word line of a selected page with the program voltage Vpgm and the verify-read voltage Vvfy.

The program controller 170 may regulate the page buffer 130. The page buffer 130 may include a plurality or pluralities of page buffer units and each page buffer unit may correspond to at least one bit line of the cell array 110. The page buffer 130 may function as a sense amplifier and/or write driver in accordance with an operating mode. Each page buffer unit may be electrically coupled to a bit line or one bit line of a bit line pair, and may be configured to read and/or store data bits from/to the cell array 110 through the bit line. Each page buffer unit may include a first latch and a second latch. The first latch may be used to store an MSB data bit for an MSB programming operation. In operation, each page buffer unit may read a result of LSB programming operation from each memory cell, and store a data bit indicating the result of reading in the second latch. Each page buffer unit may include first and second latches, and may function as a write driver during an MSB programming operation.

The program controller 170 may also regulate a Y-pass gate 140. The Y-pass gate 140 may transfer data to an input/output buffer 160 from the page buffer 130 according to a column address. The Y-pass gate 130 may transfer program data to the page buffer 130 from the input/output buffer 160. During a programming operation, the input/output buffer 160 may store (e.g., temporarily store) externally input program data, and transfer the program data to the flash memory device. During a read operation, the input/output buffer 150 may transfer read data to an external device.

The selector 160 may store information for selecting an MSB programming mode option, for example, Option 1 or Option 2 of FIG. 3 or 4. Before storing the selected option, a test process may be performed to detect a more suitable option for improved and/or optimum programming speed. According to cell characteristics detected during the test process, an option may be selected and the selector 160 may store information regarding the selected option. The selector 160 may include, for example, a fuse option circuit. In this example, information regarding the selection may be stored using a fuse programming operation that selectively cuts fuses off during the test process.

Alternatively, the selector 160 may include a pad, and may select Option 1 or Option 2 according to a bonding state of the pad. In another example, the selector 160 may be formed of a command decoder and/or register selecting Option 1 or Option 2 in response to an externally applied option selection command. In this example including a command decoder or a register, an option may be selected according to the command, and may be more flexible relative to the fuse programming and/or pad bonding type. The manner in which an option is selected may be determined based on cell characteristics evaluated through a test process.

The program controller 170 may conduct the MSB programming operation, according to a corresponding option, in response to information regarding the selected option. When Option 1 is selected, an MSB programming operation in which two cases are performed during one programming cycle may be used. For example, in the second programming stage of Option 1, where two cases are performed concurrently, one program loop may include two verify-read operations. The program controller 170 may regulate the voltage generator 180 and the page buffer 130 to perform the second programming stage.

In at least this example embodiment, the voltage generator 180 may be configured to generate a voltage, and the voltage may be provided to a word line of the cell array 110 in response to an operation of the program controller 170. The voltage generator 180 may provide a verify-read voltage Vvfy2_low lower than the normal verify-read voltage Vvfy2 during an LSB programming operation. During the MSB programming operation, the voltage generator 180 may provide word lines with the verify-read voltages corresponding to states of the MLC. In the second programming stage of Option 1, the voltage generator 180 may provide the program voltage Vpgm and two verify-read operations Vvfy1 and Vvfy2 during one program loop.

The flash memory device, according to at least this example embodiment, may select an MSB programming mode according to (e.g., optimized for) cell characteristics detected during a test process. For example, the selector 160 may select Option 2 for a memory cell programmable by a larger or relatively large number of program loops. When the MSB programming operation requires a lower or relatively low number of loops, the selector 160 may select Option 1.

Figure 7:
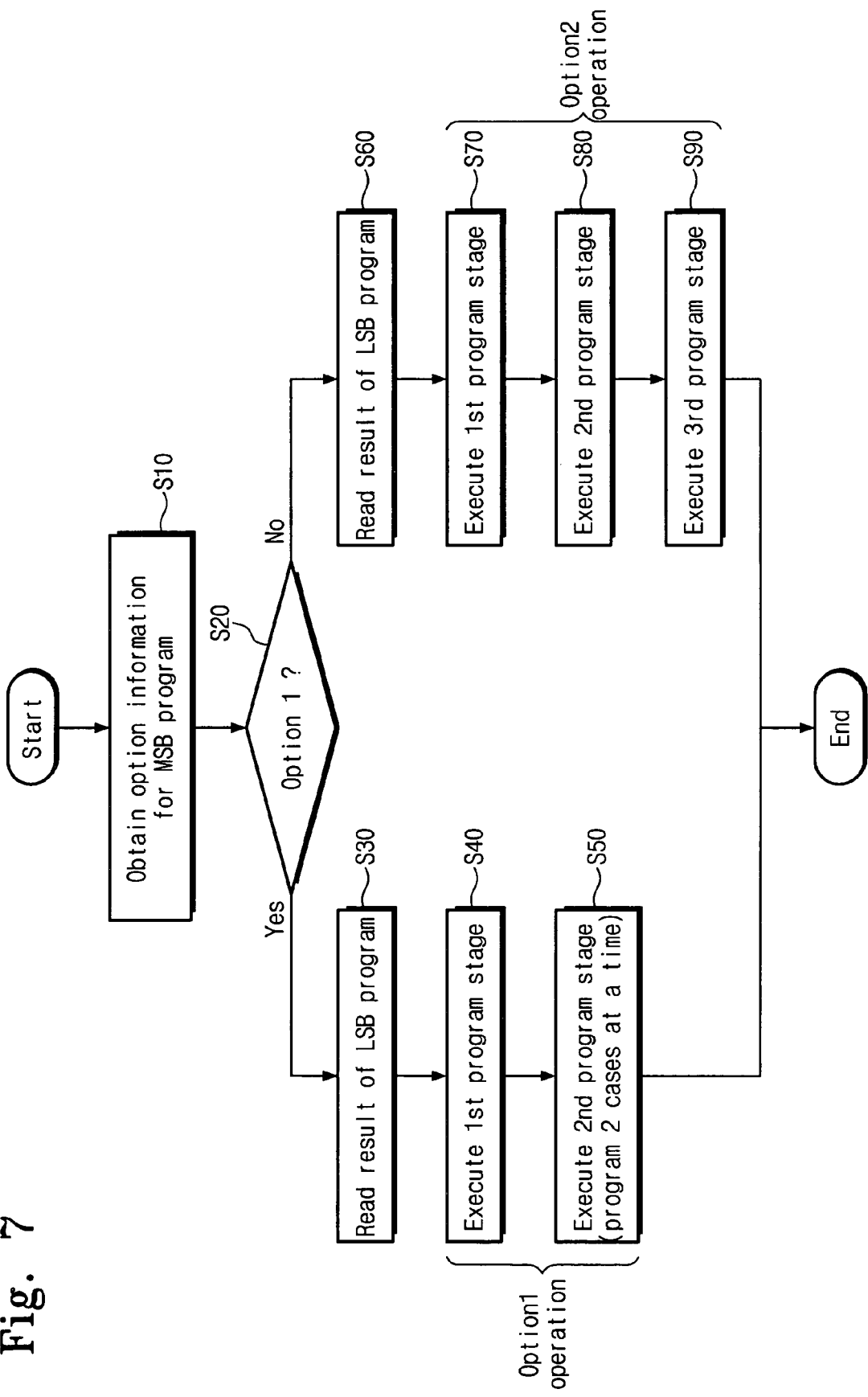
FIG. 7 is a flow chart illustrating a MLC program method, according to an example embodiment.

FIG. 7 is a flow chart explaining an MLC programming method, according to an example embodiment. The example embodiment shown in FIG. 7 may be performed by the program controller 170 of FIG. 6. As illustrated in conjunction with FIG. 6, the program controller 170 may program an MSB page according to Option 1 or 2 in response to selection information (e.g., Option1 or Option2) from selector 160. Programming methods, according to each option will now be described with reference to the accompanying drawings.

After programming an LSB page, memory cells of an MSB page may be programmed using an MSB programming operation. For the MSB programming operation, the program controller 170 may receive information corresponding to an option from selector 160 (S10). The program controller 170 may determine whether the received information corresponds to Option 1 or Option 2 (S20).

If the received information corresponds to Option 1, the MSB programming operation may be performed according to Option 1 using two program cycles. For example, data may be read from memory cells in the unit of page programmed with LSBs (S30). From a result of the LSB programming operation, the program controller 170 may determine whether threshold voltages of memory cells are in erased state '11' or provisional state '10*'. If the memory cells programmed with LSBs remain in erased state '11', first latches of page buffers corresponding to the memory cells may be provided with '1'. However, if the memory cells have been programmed with LSBs in provisional state '10*', data '0' may be written in first latches of the corresponding page buffer 130, and MSB page data to be programmed may be loaded into the second latches of the corresponding page buffer 130. The program controller 170 may execute the first programming stage by performing one of the three cases with latched data of the page buffer 130. In at least some example embodiments, the program controller 170 may perform the first programming stage according to Case3, in which memory cells may be programmed from the provisional state '10*' into state '00' (S40).

After completing the first programming stage, for which a transition of state is completed, the program controller 170 may execute the second programming stage for generating two state transitions using one programming operation. As discussed above, Case3 may be performed during the first programming stage, and Case1 and Case2 may be performed simultaneously during the second programming operation. In at least this example, one program loop may include two verify-read operations for detecting pass states from results of the two transitions. When Case1 and Case2 are applied during the second programming stage, one program loop may include two verify read operations. In other words, a program loop may include two verify-read operations each with the verify-read voltages Vvfy1 and Vvfy2 for sensing programmed results to the states '01' and '10'. After completing the two state transitions, the programming operation for the MSB page may be terminated (S50).

If the MSB programming method operates according to Option 2 (S20), the program controller 170 may perform the programming according to Option 2 by which one state transition is generated in one program cycle. For example, the program controller 170 may read results of programming LSBs (S60). From the results of programming LSBs, the program controller 170 may determine if the threshold voltages of the memory cells are in erased state '11' or provisional state '10*'. A data '0' may be written in the first latches corresponding to memory cells in erased state '11'. MSB page data to be programmed may be loaded on the second latches of the page buffer 130. The program controller 170 may execute the first programming stage with reference to the data loaded on the page buffer 130. In one example, Case3 may be performed to enable a state transition from '10*' to '00' in the first programming stage (S70). During the second programming stage, Case2 may be performed to enable a state transition from '10*' to '10'. In this example, Case2 may be applied to all or substantially all memory cells in state '10' (S80). During the third programming stage, the MSB programming operation may be performed according to Case1 for a state transition from '11' to '01' (S90). Although the cases corresponding each to the programming stages S70, S80, and S90 are discussed as Case3, Case2 and Case1, respectively, this arrangement is an example, and example embodiments are not restricted thereto.

Figure 8A:
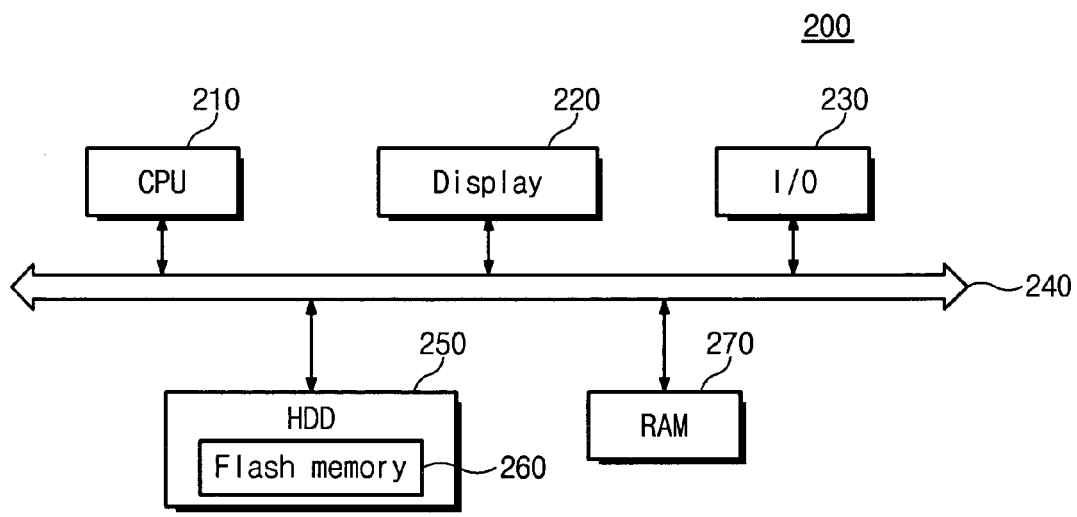
FIG. 8A is a block diagram showing an example apparatus employing a flash memory device, according to an example embodiment.

FIG. 8A is a block diagram showing an example apparatus (e.g., a mobile apparatus) employing a flash memory device, according to an example embodiment. The flash memory device including MLCs programmable using methods, according to an example embodiments, may be used for larger or relatively large capacity storage units.

Referring to FIG. 8A, the flash memory device 260 may be used in or adapted to be used in a hard disk 250 of a mobile apparatus 200. The flash memory device 260 may be usable as a larger or relatively large capacity storage unit of the hard disk 250. For example, the flash memory device 260 may be provided for a solid state disk and/or the flash memory device 260 may be usable as a flash memory component in a hybrid hard disk. In the mobile apparatus 200, data supplied from the hard disk 250 may be transferred to a RAM 270 or a central processing unit (CPU) 210 via a bus 240. Data stored in the RAM 270 and internally generated by the CPU 210 in response to an operation of an input/output unit 230 may be stored in the hard disk 250 via the bus 240. In storing data into the hard disk 250, one of the two above-described options (e.g., Option 1 or 3) may be used to program the MSB page of the flash memory device 260.

Figure 8B:
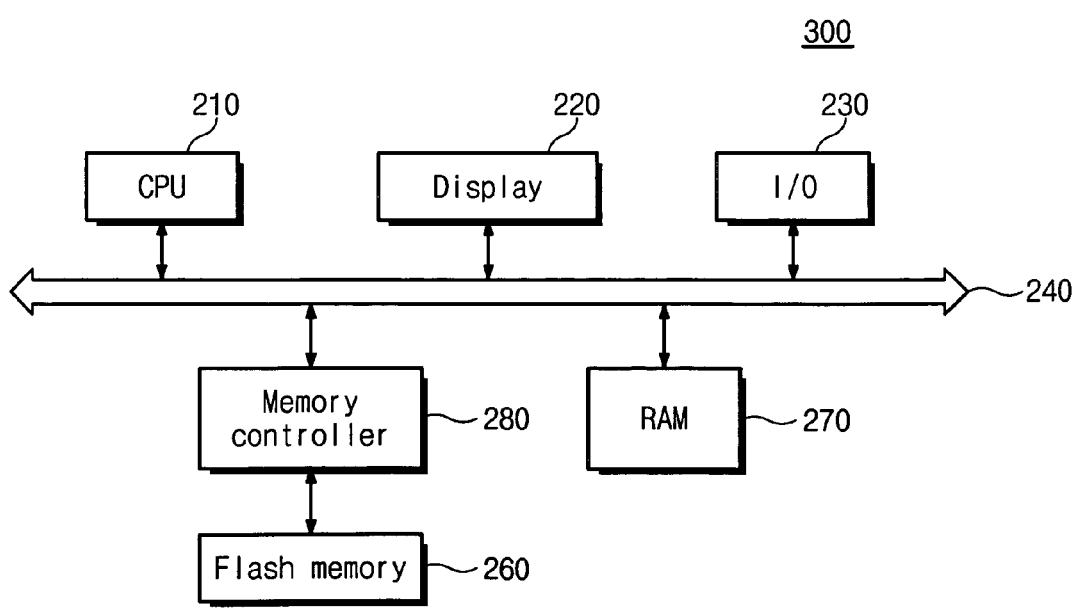
FIG. 8B is a block diagram showing another example of an apparatus employing a flash memory device, according to an example embodiment.

FIG. 8B is a block diagram showing another example apparatus (e.g., mobile apparatus) employing a flash memory device, according to an example embodiment. Referring to FIG. 8B, the flash memory device 260 may be used as a nonvolatile memory component in an apparatus 300. The apparatus 300 may be a mobile apparatus; however, it is not restricted thereto. In this example, the mobile apparatus 300 may include a memory controller 280 configured to perform an interface operation for data exchange. The memory controller 280 may perform a data input/output operation through the bus 240 of the mobile apparatus 300.

According to at least some example embodiments, flash memory devices may enhance programming speed by selecting a programming option based on evaluation data such as the number of program loops. Flash memory devices and program methods, according to example embodiments, may improve programming speed according to a programming sequence for a selected option.

Example embodiments are to be considered illustrative, but not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of programming a flash memory device, comprising:
   programming a plurality of memory cells into a provisional state, in accordance with a first page data; and
   programming the plurality of memory cells into second through fourth states from a first state or the provisional state, in accordance with a second page data,
   wherein programming the plurality of memory cells into the second through fourth states includes an operation of simultaneously programming the plurality of memory cells partially or entirely into at least two states, during one programming operation period.

2. The method as set forth in claim 1, wherein a verify-read voltage for programming the plurality of memory cells into the provisional state is higher than a verify-read voltage corresponding to the second state and lower than a verify-read voltage corresponding to the third state.

3. The method as set forth in claim 2, wherein programming the plurality of memory cells into the second through fourth states is carried out with comprising:
   a first programming stage programming the memory cells into one of the second through fourth states from the first or provisional state; and
   a second programming stage simultaneously programming the memory cells from the first or provisional state into the rest two states that are excluded from the first programming stage, during said one programming operation period.

4. The method as set forth in claim 3, wherein the first programming stage is provided to program the memory cells which have been programmed into the provisional state, into the fourth state in accordance with the second page data.

5. The method as set forth in claim 4, wherein during the second programming stage, the memory cells excluded from the first programming stage are simultaneously programmed into the second state from the first state, in accordance with the second page data, and into the third state from the provisional state.

6. The method as set forth in claim 5, wherein the first, second, third, and fourth states correspond to '11', '01', '10', and '00', respectively, and the provisional state correspond to a provisional '10" higher than the second state but lower than the third state.

7. The method as set forth in claim 6, wherein the second programming state is carried out with including a program loop conducting two times of verify-read operations for verifying whether the memory cells have been programmed into the second and third states.

8. The method as set forth in claim 1, wherein said one programming operation period is a program cycle for which 1-bit data is written in an incremental step pulse programming (ISPP) mode.

9. A method of programming a flash memory device, comprising:
   programming a plurality of memory cells into a provisional state, in accordance with a first page data; and
   programming the plurality of memory cells into second through fourth states from a first or provisional state, in accordance with one of different programming modes, in response to information of option for selecting a mode of programming a second page data.

10. The method as set forth in claim 9, wherein programming the plurality of memory cells into the second through fourth states comprises, when a first program mode is selected from the different programming modes in accordance with the information of option, a step of programming the plurality of memory cells from the first or provisional state into the second, third, or fourth state in accordance with the second page data, the plurality of memory cells being simultaneously programmed into at least two states during one programming operation period.

11. The method as set forth in claim 10, wherein the first programming mode comprises:
   a first programming stage programming the memory cells into one of the second through fourth states from the first or provisional state; and
   a second programming stage programming the memory cells from the first or provisional state into the rest two states that are excluded from the first programming stage, during the same programming operation period.

12. The method as set forth in claim 11, wherein the memory cells, which have been programmed into the provisional state with the first page data, are partially or entirely programmed into the fourth state in accordance with the second page data during the first programming stage.

13. The method as set forth in claim 12, wherein during the second programming stage, the memory cells excluded from the first programming stage are simultaneously programmed into the first state from the second state, in accordance with the second page data, and into the third state from the provisional state.

14. The method as set forth in claim 13, wherein the first, second, third, and fourth states correspond to '11', '01', '10', and '00', respectively, and the provisional state correspond to a provisional '10' higher than the second state but lower than the third state.

15. The method as set forth in claim 13, wherein said one programming operation period is a program cycle for which 1-bit data is written in an incremental step pulse programming (ISPP) mode.

16. The method as set forth in claim 15, wherein the second programming state is carried out with including a program loop conducting two times of verify-read operations for verifying whether the memory cells have been programmed into the second and third states.

17. The method as set forth in claim 9, wherein programming the plurality of memory cells into the second through fourth states comprises, when a second program mode is selected from the different programming modes in accordance with the information of option, steps of programming the plurality of memory cells from the first or provisional state into one of the second through fourth states in accordance with the second page data, each step programming the plurality of memory cells into one state during said one programming operation period.

18. The method as set forth in claim 17, wherein the second programming mode comprises:
   a first programming stage programming selected memory cells into the fourth state from the provisional state in response to the second page data;
   a second programming stage programming selected memory cells into the third state from the provisional state in response to the second page data; and
   a third programming stage programming selected memory cells into the second state from the first state in response to the second page data.

19. The method as set forth in claim 18, wherein the first, second, third, and fourth states correspond to '11', '01', '10', and '00', respectively, and the provisional state correspond to a provisional '10' higher than the second state but lower than the third state.

20. A flash memory device comprising:
   a cell array having a plurality of memory cells storing multi-bit data that represents at least one of first through fourth states and includes a most and a least significant bits;
   a voltage generator configured to generate and provide a program voltage and verify-read voltages to a word line of memory cells selected from the plurality of memory cells;
   a page buffer coupled to bit lines respective to the plurality of memory cells, writing the multi-bit data into the selected memory cells and conducting verify-read and read operations;
   a program controller regulating the page buffer and the voltage controller to program the most significant bits into the plurality of memory cells in response to information of option; and
   an option selector configured to select one of first and second options in a programming mode with the most significant bit, generating the information of option.

21. The flash memory device as set forth in claim 20, wherein the program controller, when the information of option is generated in correspondence with the first option, regulates the page buffer and the voltage generator to program the plurality of memory cells into two states during one programming cycle, while programming the most significant bit.

22. The flash memory device as set forth in claim 21, wherein the program controller regulates the page buffer and the voltage generator to program the plurality of memory cells into the second through fourth states from the first or provisional state in response to the most significant bit, the plurality of memory cells being programmed into at least two states during said one programming cycle.

23. The flash memory device as set forth in claim 22, wherein the program controller conducts a first programming state to program the memory cells from the first or provisional state into one of the second through fourth stages and during said one program cycle, a second programming stage to program the memory cells from the first or provisional state into the rest two states excluded from the first programming stage.

24. The flash memory device as set forth in claim 23, wherein the program controller operates to program the memory cells, which have been programmed into the provisional state during the first programming stage, into the fourth state in response to the most significant bit.

25. The flash memory device as set forth in claim 24, wherein during the second programming stage, the program controller operates to simultaneously program the memory cells, which are excluded from the first programming stage, into the second state from the first state, in response to the most significant bit, and into the third state from the provisional state.

26. The flash memory device as set forth in claim 25, wherein the first, second, third, and fourth states correspond to '11', '01', '10', and '00', respectively, and the provisional state correspond to a provisional '10' higher than the second state but lower than the third state.

27. The flash memory device as set forth in claim 25, wherein the program controller regulates the voltage generator and the page buffer to conduct two times of verilty-read operations for verifying whether the memory cells have been programmed into the second and third states in one program loop during the second programming stage.

28. The flash memory device as set forth in claim 20, wherein the program controller, when the information of option is generated in correspondence with the second option, regulates the page buffer and the voltage generator to program the plurality of memory cells into one state during one programming cycle while programming the most significant bit.

29. The flash memory device as set forth in claim 28, wherein the program controller operates to program selected memory cells: into the fourth state from the provisional state in response to the most significant bit; into the third state from the provisional state in response to the most significant bit; and into the second state from the first state in response to the most significant bit.

30. The flash memory device as set forth in claim 29, wherein the first, second, third, and fourth states correspond to '11', '01', '10', and '00', respectively, and the provisional state correspond to a provisional '10' higher than the second state but lower than the third state.

31. The flash memory device as set forth in claim 20, wherein the page buffer comprises:
   a first latch storing data of programmed result for the least significant bit; and
   a second latch storing the most significant bit to be programmed.

* * * * *